(12) United States Patent
Rauls et al.

(10) Patent No.: US 7,128,784 B2
(45) Date of Patent: Oct. 31, 2006

(54) SMALL PARTICLE-ADJUSTMENT CRYSTALLIZATION PROCESS

(75) Inventors: Matthias Rauls, Limburgerhof (DE); Richard van Gelder, Speyer (DE); Katrin Wagner, Mannhein (DE); Harald Bernard, Wachenheim (DE)

(73) Assignee: BASF Aktiengesellschaft, Ludwigshafen (DE)

( * ) Notice: Subject to any disclaimer, the term of this patent is extended or adjusted under 35 U.S.C. 154(b) by 106 days.

(21) Appl. No.: 10/197,444

(22) Filed: Jul. 18, 2002

(65) Prior Publication Data

US 2003/0051659 A1 Mar. 20, 2003

(30) Foreign Application Priority Data

Jul. 30, 2001 (DE) ................ 101 37 017

(51) Int. Cl.
*C30B 25/12* (2006.01)

(52) U.S. Cl. .................. 117/68; 424/45; 424/46; 514/725

(58) Field of Classification Search ........... 117/68; 424/45, 46; 514/725
See application file for complete search history.

(56) References Cited

U.S. PATENT DOCUMENTS

| | | | | |
|---|---|---|---|---|
| 5,143,965 A | * | 9/1992 | Mertz | 524/436 |
| 5,556,611 A | * | 9/1996 | Biesalski | 424/46 |
| 5,981,029 A | * | 11/1999 | Harada et al. | 428/143 |
| 6,221,398 B1 | | 4/2001 | Jakupovic et al. | 424/489 |

FOREIGN PATENT DOCUMENTS

| | | |
|---|---|---|
| EP | 0 449 008 | 10/1991 |
| EP | 0 797 562 | 10/1997 |
| WO | WO 00/32597 | 6/2000 |
| WO | WO 00/38811 | 7/2000 |

\* cited by examiner

*Primary Examiner*—Felisa Hiteshew
(74) *Attorney, Agent, or Firm*—Novak Druce & Quigg, LLP

(57) ABSTRACT

The present invention relates to a process for crystallizing small particles with a narrow particle size distribution. The crystals of the invention are obtained by introducing ultrasound into a solution or suspension of the substance to be crystallized while simultaneously adjusting a particular specific stirring power.

11 Claims, No Drawings

SMALL PARTICLE-ADJUSTMENT CRYSTALLIZATION PROCESS

The present invention relates to a process for crystallizing small particles with a narrow particle size distribution. The crystals of the invention are obtained by introducing ultrasound into a solution or suspension of the substance to be crystallized while simultaneously adjusting a particular specific stirring power.

The process is particularly suitable for crystallizing active substances, preferably polyolefinic active substances such as, for example carotenoids or retinoids.

For many applications, especially for the preparation of active substances, it is of interest to achieve an accurately defined small particle size with, at the same time, a narrow particle size distribution because it is possible in this way, on the one hand, often to ensure better processing and, on the other hand, for example with active substances to achieve better bioavailability.

The adjustment of a desired particle size to a defined value with, at the same time, a narrow particle size distribution is not without difficulties for many products.

It is known that the properties of crystals can be modified by ultrasound. It is moreover possible to influence both the size and the shape of the crystals. It is additionally known from the literature that more uniform crystals with a narrower particle size distribution can be achieved by ultrasound crystallization (inter alia T. J. Mason, Chemistry with Ultrasound, Critical Reports on Applied Chemistry, 28, 1990; T. J. Mason, J. P. Lorimer, Sonochemistry: Theory, Applications and Uses of Ultrasound in Chemistry, Ellis Horwood Ltd., Chichester, 1988).

WO 00/32597 (Smithkline Beecham PLC) describes the advantages of using ultrasound for crystallizing a paroxetine hydrochloride propan-2-ol solvate. The insonation in this case is preferably carried out with slow cooling within the metastable zone and maintained on further cooling. This results in a product which is easy to stir, wash and filter and which moreover dissolves better than conventionally crystallized products.

EP 0797562 B1 (DuPont) describes similar effects of ultrasound for the crystallization of adipic acid. The average particle size is slightly reduced by ultrasound (from 330 to 300 µm, i.e. reduction of <10%) or even increases (from 207 to 215 µm, i.e. increase of about 4%).

Ultrasound can be introduced into a reactor in various ways. A distinction is made in this connection between a direct introduction of the sound by immersing a vibrating mass in the medium and the coupling to container walls, where appropriate with use of a coupling fluid. Three basic types of sound emitters exist: sonotrodes, surface transducers (e.g. ultrasound baths) and flow cells. The use of ultrasound in a bypass of the actual reactor is also conceivable.

The effect of ultrasound during crystallization results from collision processes in the suspension which bring about both microstreaming and bulk streaming, from shock waves (energy transfer) and from shear processes. The sound emitters which are therefore usually needed are those which introduce a large amount of energy into the system and which, at the same time, have large amplitudes, i.e. a high intensity (e.g. sonotrodes). If ultrasound is employed only for the purposes of seeding for the crystallization, it is also usually possible to use sound emitters of low intensity.

Because of the streaming induced by cavitation, solids in heterogeneous systems tend to move out of zones of high ultrasonic intensity. For heterogeneous systems it is therefore normally necessary to have internals which keep the solids in zones of high sound intensity. Flow cells have proved suitable for the insonation of suspensions. Sonotrodes generate a sonic field which has high intensities only in the direct vicinity of the sound emitter. In large stirred vessels, this results in some large regions with only low sonic pressures, and uninsonated regions, and uniform insonation of solids in suspensions is possible only with difficulty. A scale-up of ultrasonic reactors in which the ultrasound is introduced via sonotrodes is difficult because the sonic fields differ in stirred vessels which differ in size. Technical applications of ultrasound for crystallization are therefore frequently restricted to small stirred vessels on the laboratory scale (see, for example, WO 00/32597,Smithkline Beecham PLC, or EP 0797562 B1, DuPont—in both patents, the examples which are indicated evidently relate to 1 l crystallizers) or to flow cells which are operated in a bypass (e.g. EP 0449008 B1, UK Atomic Energy Authority/Harwell Laboratory). However, the disadvantage in this case is the uncontrolled attrition of particles in the pump necessary for the circulation.

It is an object of the present invention to prepare crystals which have a small particle size ($d_{0.5}$<100 µm; $d_{0.1}$>45 µm; $d_{0.9}$<295 µm) with, at the same time, a narrow particle size distribution, which can easily be filtered and granulated, and which in the case of active substances additionally have good bioavailability.

We have found that this object is achieved by a process for crystallizing crystals with an average particle size of <100 µm, wherein the crystallization takes place with simultaneous use of ultrasound which is introduced by a sonotrode directly into the solution or suspension of the compound to be crystallized, and with a particular specific stirring power.

The process of the invention is particularly suitable for crystallizing active substances, in particular for polyene-containing active substances such as, for example, carotenoids or retinoids.

The invention comprises the provision of a process for crystallizing retinoic acids by use of ultrasound which is introduced by a sonotrode directly into the solution/suspension. It is moreover possible to utilize an available stirred vessel. Unlike systems described in the prior art, the system used here is suitable not only for crystallizations on the laboratory scale (1 to 3 l) but also for stirred vessels on the pilot plant or commercial scale (>30 l). The direct insonation of the suspension in the stirred vessel avoids uncontrolled attrition of the solid in a pump in the circulation. A suitable flow management by baffles, guide plates and/or suitable stirrer shapes ensures that the solid particles are transported sufficiently rapidly to the regions of high ultrasonic intensity and remain there long enough. Ultrasound sonotrodes with a frequency of from 16 to 100 kHz and, depending on the size of the stirred vessel, with a power of from 250 to 4000 W are used. The amplitude of the sonotrode can be adjusted within wide limits.

The size of the particles generated, and the width of the particle size distribution can with the novel process be adjusted within wide limits via the ultrasonic intensity, duration and timing of the insonation and via the stirring power input. Surprisingly, the particle size of the crystals generated with the aid of ultrasound is, unlike in conventional crystallization processes, reduced by introducing a lower specific stirring power. The specific stirring power $P_R$ in this connection is defined as follows:

$$\frac{P_R}{m_{sol}} = \frac{Ned^5n^3\rho_{sol}}{m_{sol}} = \frac{Ned^5n^3}{V_{sol}} \quad (1)$$

with $m_{sol}$=mass of the solution employed
Ne=f (Re)=power factor of the stirrer
d=stirrer diameter
n=speed of stirrer rotation
$V_{sol}$=volume of the solution employed However, too large a reduction in the specific stirring power leads to an inadequate suspension of the particles, which thus inter alia no longer reach the zones of high ultrasonic intensity sufficiently frequently.

The ultrasound alters both the size of the crystals and their shape (production of uniform, almost spherical particles in place of large needles and fragmentary fines). It was demonstrated with the aid of an X-ray diffractogram that the modification, for example in the case of 13-(Z)-retinoic acid, is not altered by the insonation (copper radiation at 25° C.: main peaks at approximately 10.4/15.9/16.4/18/20.2/21.8/24.8/26.8 Å).

The process of the invention is suitable in principle for crystallizing any substance, but it is preferably suitable for crystallizing active substances, their esters and physiologically tolerated salts.

Active substances preferably mean polyene-containing active substances, for example carotenoids or retinoids. The carotenoids mean, for example, β-carotene, γ-carotene or β-apo-8'-carotenal.

The retinoids mean, for example, retinol, retinal, 9-(Z)-retinoic acid, 13-(Z)-retinoic acid (isotretinoin) or all (E)-retinoic acid (tretinoin). However, the process is particularly suitable for crystallizing 13-(Z)-retinoic acid.

The crystallization of the invention is carried out in solution or suspension of the substance to be crystallized. Moreover, the concentration of the substance to be crystallized is between 1 and 20% by weight, preferably between 4 and 17% by weight.

The solvents employed are solvents suitable for the particular substance and for ultrasonic use.

If the substances are selected from the group of carotenoids, solvents which can be employed are chlorinated hydrocarbons or, for example, ethanol. Solvents suitable for retinoids are low molecular weight n and iso alcohols of methanol, ethanol, propanol, butanol, pentanol or hexanol, and 2-propanol is particularly preferably used.

The crystallization can be carried out in any suitable crystallizer, for example in a stirred vessel or a draft tube crystallizer. The temperature in the crystallizer is between −10 and 120° C., preferably between 0 and 80° C.

The crystallization can be carried out both as cooling crystallization with a constant cooling rate or as cooling program with different cooling rates.

The particle size of the crystals is <100 μm, and is preferably between 30 and 90 μm.

It is likewise possible to vary the duration of the use of ultrasound. Ultrasound can be employed throughout the crystallization process or only during the nucleation phase or only after maximal supersaturation has been reached.

The frequency of the ultrasound is between 16 to 100 kHz with an intensity of up to 4 W cm$^{-2}$.

The specific stirring power $P_R$ is between 0.2 to 2 W kg$^{-1}$, preferably between 0.3 to 1 W kg$^{-1}$.

The solids content in the crystallizer is between 0 and 30% by weight, preferably between 5 and 20% by weight.

If the particles prepared by the process of the invention are active substances, they are used together with conventional excipients for producing pharmaceutical or cosmetic dosage forms or as additions in human or animal foods.

The isotretinoin mentioned in the examples is employed, for example, for the oral treatment of skin disorders (acne).

The crystallization process of the invention has the following advantages:

An additional process step for adjusting the desired small particle size is avoided.

Besides a smaller particle size and a narrower particle size distribution than with conventional crystallization processes, the resulting product has better flow characteristics and higher bioavailability.

No additives are necessary in the crystallization process in order to influence the size and shape of the crystals.

The purity of the resulting products is higher than with previous conventional cooling crystallization processes.

The particle size distribution can be influenced specifically not only via the temperature program during cooling but also via the parameters of ultrasonic intensity, specific stirring power and ultrasound duration.

The reproducibility of the particle size distribution is higher than with conventional crystallization processes.

Modification of available crystallizers is possible without difficulty.

The following examples are intended to illustrate the invention in detail without, however, restricting it thereto:

EXAMPLE 1

Crystallization With and Without Ultrasound

A solution with 15.4% by weight isotretinoin in 2-propanol is stirred in a 3 l stirred vessel with a specific stirring power of 0.5 W kg$^{-1}$ and cooled, starting from an initial temperature of 72° C., at a cooling rate of 3K h$^{-1}$ to 50° C. and further at 10K h$^{-1}$ to 0° C. (sample 1). With sample 2, ultrasound is introduced via a 250 W sonotrode with a frequency of 20 kHz throughout the process. In both cases, the solution is then stirred at 0° C. for one hour without ultrasound. The resulting average particle size $d_{0.5}$ (volume-based) and the steepness of the distribution (span S) corresponding to $$S = \frac{d_{0.9} - d_{0.1}}{d_{0.5}} \quad (2)$$

are indicated for each case in table 1.

TABLE 1

Particle size and span for the crystallization of isotretinoin with and without ultrasound:

| Sample No. | Description | $d_{0.5}/\mu m$ | S |
|---|---|---|---|
| 1 | without US | 227.2 | 2.20 |
| 2 | with US | 57.9 | 1.13 |

EXAMPLE 2

Variation of the Specific Stirring Power

A solution of isotretinoin in 2-propanol is crystallized using ultrasound in analogy to example 1. Various quantities of specific stirring power $P_R$ between 1.5 W kg$^{-1}$ (sample 3) and 0.25 W kg$^{-1}$ (sample 4) are introduced during this. The results are shown in table 2. In relation to the specific stirring power there is an optimum in the region of moderate stirring power (sample 2) at which both the smallest average particle size and a very narrow distribution are achieved.

TABLE 2

Particle size and span for ultrasonic crystallization of isotretinoin with various stirring powers

| Sample No. | $P_R$/(W kg$^{-1}$) | $d_{0.5}$/μm | S |
|---|---|---|---|
| 3 | 1.5 | 72.0 | 1.44 |
| 2 | 0.5 | 57.9 | 1.13 |
| 4 | 0.25 | 66.2 | 1.65 |

EXAMPLE 3

Variation of Insonation Timing and Duration

A solution of isotretinoin in 2-propanol is crystallized using ultrasound with a specific stirring power of 0.5 W kg$^{-1}$ in analogy to example 1. The insonation timing and duration are varied. Table 3 shows the results for an insonation at the start of the crystallization process from the initial temperature down to 55° C. (sample 5) and for an insonation at the end of the process from 59° C. to 0° C. (sample 6). The results without insonation and for an insonation throughout the cooling process are indicated in example 1 (samples 1 and 2). The use of ultrasound only at the start of the crystallization process (in the nucleation region) allows generation of a particle size distribution which is just as narrow as with ultrasound throughout the process, although there is a simultaneous increase in the average particle size.

TABLE 3

Particle size and span for a crystallization of isotretinoin with varying duration of insonation

| Sample No. | Use of ultrasound | $d_{0.5}$/μm | S |
|---|---|---|---|
| 1 | none | 227.2 | 2.20 |
| 5 | down to 55° C. | 139.0 | 1.26 |
| 6 | from 59° C. to 0° C. | 83.4 | 1.72 |
| 2 | down to 0° C. | 57.9 | 1.13 |

EXAMPLE 4

Variation of the Initial Isotretinoin Concentration (Solvent Ratio)

The solvent ratio (2-propanol:isotretinoin ratio) is varied during crystallization of isotretinoin with ultrasound. A solution with an initial concentration of 15.4% by weight isotretinoin in 2-propanol (solvent ratio 5.5:1) is used as comparative sample (sample 2). A solution with 8.3% by weight isotretinoin in 2-propanol (solvent ratio 11:1) is crystallized under the conditions mentioned in example 1 (3 l crystallizer, specific stirring power: 0.5 W kg$^{-1}$, cooling program, ultrasound: 250 W throughout the cooling phase, subsequent stirring phase) (sample 7). The results are shown in table 4. An alteration in the solvent ratio during the ultrasonic crystallization of isotretinoin accordingly has no significant effect on the average particle size or the width of the particle size distribution.

TABLE 4

Particle size and span for an ultrasonic crystallization of isotretinoin with different solvent ratios

| Sample No. | $w_{Isotretinoin}$/% by weight | Solvent ratio | $d_{0.5}$/μm | S |
|---|---|---|---|---|
| 2 | 15.4 | 5.5:1 | 57.9 | 1.13 |
| 7 | 8.3 | 11:1 | 62.6 | 1.26 |

We claim:

1. A process for crystallizing crystals with an average particle size of <100 μm, wherein the crystallization takes place in a crystallizer with simultaneous use of ultrasound which is introduced by a sonotrode directly into a solution or suspension of an active substance to be crystallized, and with a specific stirring power from 0.2 to 2 W kg$^{-1}$, wherein the active substance to be crystallized is selected from carotinoids or retinoids, and wherein the crystallization is carried out as a cooling crystallization with a constant cooling rate or as a cooling program with different cooling rates.

2. A process as claimed in claim 1, wherein the active substance is 13-(Z)-retinoic add.

3. A process as claimed in claim 1, wherein the active substance concentration in the solution or suspension is between 1 and 20% by weight.

4. A process as claimed in claim 1, wherein the crystallization takes place in a stirred vessel or draft tube crystallizer.

5. A process as claimed in claim 1, wherein the temperature in the crystallizer is between −10 and 120° C.

6. A process as claimed in claim 1 wherein the solids content in the crystallizer is between 0 and 30% by weight.

7. A process as claimed in claim 1, wherein the ultrasound has an ultrasonic frequency between 16 and 100 kHz and an ultrasonic intensity up to 4 W cm$^{-2}$.

8. A process as claimed in claim 1, wherein ultrasound is used throughout the crystallization process.

9. A process as claimed in claim 1, wherein ultrasound is employed only during a nucleation phase or only after a maximal supersaturation has been reached.

10. A process as claimed in claim 1, wherein the specific stirring power is from 0.3 to 1 Wkg$^{-1}$.

11. A process as claimed in claim 1, wherein the crystallization is caused solely by cooling the solution or suspension.

* * * * *